United States Patent [19]

Sklyarsky et al.

[11] Patent Number: 5,880,203
[45] Date of Patent: Mar. 9, 1999

[54] ADHESIVE COMPOSITION

[75] Inventors: Leonid Sklyarsky, Kiriat Bialik; Oleg Figovsky, Haifa, both of Israel

[73] Assignee: Eurotech Ltd., Washington, D.C.

[21] Appl. No.: 84,976

[22] Filed: May 28, 1998

[51] Int. Cl.$^6$ ............................... C08J 3/00; C08K 3/20; C08L 75/00; C08F 8/30
[52] U.S. Cl. .................. 524/507; 524/589; 524/590; 525/123; 525/127; 525/455
[58] Field of Search .................. 524/507, 589, 524/590; 525/123, 455, 127

[56] References Cited

U.S. PATENT DOCUMENTS 5,427,642  6/1995  Akiguchi et al. .

OTHER PUBLICATIONS

Kardashov, D.A., Chimia, Synthetic Glues, p. 285 (1976).
Tcherniak, K.I., Sudostroenie, "Non–metallic Materials . . . ", pp. 229–231 (1966).
Mudrov, O.A. et al., Leningrad, Sudostroenie, "Handbook of Elastomeric Coatings and Sealants in Shipbuilding," pp. 135–137 (1982).

*Primary Examiner*—Patrick Niland
*Attorney, Agent, or Firm*—Blank Rome Comisky & McCauley LLP

[57] ABSTRACT

An adhesive composition preferably for use in bonding of electronic parts on a board, said composition comprising a) 12.0–18.0 weight % of a first resin, said first resin being a cross-linkable clathrate matrix resin,
b) 8.0–22.0 weight % of a particulated filler,
c) 15.0–30.0 weight % of a cross-linking agent capable of cross-linking said first resin,
d) 1.5–3.5 weight % of a second resin, said second resin being an olygodieneurethane resin with the end oxymethyloxazolidone groups, said second resin having general chemical formula

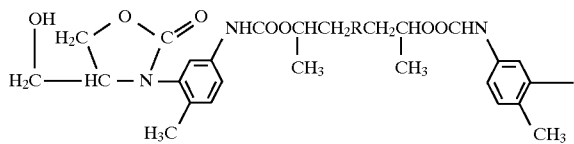

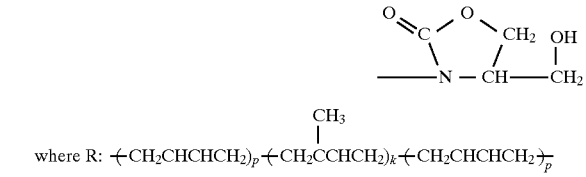

$p=17-31$, $k=8-15$, e) 35.0–60.0 weight % of an organic solvent.

5 Claims, No Drawings

ADHESIVE COMPOSITION

FIELD OF THE INVENTION

The present invention deals with adhesive composites used in electronic industry for securing various electrical radio and electronic components on a printed circuit board, a base plate, etc. as it is required during the manufacturing process. More particularly the present invention refers to an adhesive composition comprising a synthetic rubber to be hardened at room temperature. The new composition has improved corrosion resistance to copper, silver and other metals, improved adhering strength and thermal shock resistance.

BACKGROUND OF THE INVENTION

The use of adhesives in electronic industry is well known and in the prior art there are described various adhesive compositions used for this purpose. An example of such an adhesive composition can be found in a handbook "Non metallic materials . . . " by Tcherniak K. I., Sudostroenie, 1966, pp. 229–231. This composition is based on polychloroprene rubber, titan dioxide and triphenylmethane triisocyanate. The main disadvantage of this composition lies in the fact that it reacts with copper of the conducting wiring and this deteriorates the reliability of bonding.

There is known another adhesive composition, as described for example in "Handbook of elastomeric coatings and sealants in shipbuilding" by Mudrov O. A., Savchenko I. M. and Shitov V. S., Leningrad, Sudostroenie, 1982, pp. 135–137. This adhesive composition designated as EKM includes polydieneurethane diepoxide epoxy resin, amine curing agent and a filler. Unfortunately this composition is not convenient in use since it hardens only after heating at elevated temperatures and therefore it undergoes corrosion in contact with copper.

There are known also another adhesive composition as described in Akiguchi's U.S. Pat. No. 5,427,642, which suffers from the same disadvantage seeing that it also should be heated in order to cause the hardening thereof.

The most relevant to the subject of the present invention is an adhesive composition, which is disclosed in a book "Synthetic glues" by Kardashov D. A., Chimia, 1976, p.285. This composition includes a cross-linkable synthetic rubber, a filler, triphenyl-methane, 4,4'4" triisocyanate and a solvent. As a synthetic rubber, butadiene-styrene rubber is used. This adhesive composition hardens at room temperature, it does not react with copper and it is resistant to humidity. Unfortunately its adhesive strength deteriorates in condition of thermal shock and therefore performances of this composition are not sufficiently reliable for the use in electronic industry.

Thus despite of existence of various adhesive composition available for fastening of various components in electronic industry there still exists a need in a new and improved composition having high adhesive strength, which does not react with copper and which can be easily integrated in the existing manufacturing process.

OBJECT OF THE INVENTION

The object of the present invention is to provide a new and improved adhesive composition which will sufficiently reduce or overcome the above mentioned drawbacks of the prior art adhesive compositions.

In particular, the main object of the present invention is to provide a new and improved adhesive composition having superior reliability of its adhesive properties in terms of shear strength either at room or at elevated temperature, in conditions of thermal shock or in the presence of copper.

The above and other objects and advantages of the present invention can be achieved in accordance with the following combination of its essential features, referring to different embodiments thereof.

DETAILED DESCRIPTION OF THE PREFERRED EMBODIMENTS

It has been empirically revealed that an adhesive composition wit improved adhesive properties can be prepared by polymerization of two resins one of which is an olygodieneurethane resin with the end oxymethyloxazolidone groups. In the further description this olygodieneurethane resin will be referred to as OD. The oligodieneurethane resin (OD) used for the preparation of adhesive composition of the present invention has the following general chemical formula:

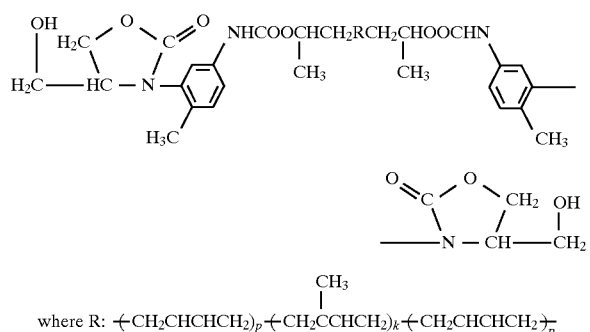

where R: $+CH_2CHCHCH_2)_p+CH_2CCHCH_2)_k+CH_2CHCHCH_2\frac{1}{p}$ and p=17–31, k=8–15.

In practice the radical R should be an aliphatic hydrocarbon which does not contain aromatic rings. The carbon chain of this hydrocarbon should be sufficiently long for rendering the resin high conformational mobility and molecular weight between 3000 and 5000.

An OD resin can be synthesized by heating of olygodieneurethane diepoxide, which further will be referred to as OP in the presence of a catalyst, e.g. refined 2,4,6-tris-(dimethylamine methyl)-phenol.

In the following non limiting examples it is explained in details how some olygodieneurethane resins can be prepared.

EXAMPLE 1

324.5 g of OP containing 1.82% of epoxy groups is heated up to 45–50° C. and mixed wit 0.1 g of the above catalyst during 20–30 minutes. The temperature is increased up to 65° C. and the reagents are kept at this temperature for 17 hours. The resulting OD resin, which will be further referred to as OD-1 is cooled to the room temperature. The yield of OD-1 is nearly 100%. The obtained OD-1 is a highly viscose, sticky mass of light brown color which is soluble in organic liquids. It is insoluble in water.

By purification of the resin OD-1 from catalyst, for example by refining, the refined resin is produced, which will be further referred to as OD-2.

EXAMPLE 2

The reaction is carried out similar to what is described in example 1.

290.1 g of OP, containing 2.10% of epoxy groups is mixed with 0.12 g of the above catalyst. The yield of the end product which will be further referred to as OD-3 is nearly 100% as compared to the theoretical value.

EXAMPLE 3

The reaction is carried out similar to what is described in example 1.

367.7 g of OP, containing 2.71% of epoxy groups is mixed with 0.14 g of the above catalyst. The yield of the end product which will be further referred to as OD-4 is nearly 100% as compared to the theoretical value.

the properties of the above referred to olygodieneurethane resins OD-1, OD-2, OD-3, OD-4 are summarized in the following non limiting table 1.

TABLE 1

| Property | Olygodieneurethane resin | | | |
|---|---|---|---|---|
|  | OD-1 | OD-2 | OD-3 | OD-4 |
| Mean molecular mass $M_a$, | | | | |
| Theoretical | 4720 | 4720 | 4100 | 3170 |
| Experimental | 4930 | 4905 | 3820 | 3330 |
| Content of OH-groups, %, | | | | |
| Theoretical | 0.72 | 0.72 | 0.83 | 1.07 |
| Experimental | 0.69 | 0.69 | 0.89 | 1.02 |
| Content of nitrogen, % | | | | |
| Theoretical | 1.19 | 1.18 | 1.37 | 1.77 |
| Experimental | 1.14 | 1.13 | 1.46 | 1.33 |
| Content of epoxy groups, %, | | | | |
| Theoretical | 0 | 0 | 0 | 0 |
| Experimental | not found | not found | not found | not found |

The absorbtion lines of the groups NH, CO, and OH were revealed by means of the IR spectroscopy and by the functional elemental analysis.

The resins synthesized as per above described procedures were used for manufacturing of adhesive compositions of the present invention. These compositions comprise a cross-linkable clathrate matrix polymer, a filler for the strengthening thereof, a crosslink agent, an olygodieneurethane resin (OD), and a solvent.

The matrix polymer employed in the present invention is a co-polymer of butylacrylate and acrylonitrile which further will be referred to as CBA. Some examples of commercially available CBA co-polymers comprise Hycar 2121×27 manufactured by BF Goodrich Company, Paracril OHT, Paracril PR120 manufactured by Uniroyal Chemical Company Inc.

As a filler one can use a powder of an inorganic compound having surface area of at least 1500 cm²gram. The non limiting list of suitable compounds comprises: ZnO, $CaCO_3$, $TiO_2$, BN. In practice one can use for example $TiO_2$ powder commercially available as Kemira RR-Z manufactured by Kemira Inc. or Bayertitan R-KB-4 manufactured by Bayer AG.

As a cross-link agent one can use polyisocyanate, for example solution of triphenylmethane 4,4',4" triisocyanate further referred to as TPT in dichlorethane, methylenechloride or ethyl acetate.

In practice the suitable cross-link TPT agent is commercially available as Desmodur-R, or Desmodur RE, manufactured by Bayer AG.

As suitable solvent one can use ethylacetate, methylethylketone, toluene, butylacertate or their mixtures.

The general formulations of adhesive compositions of the present invention are summarized in the following non limiting table 2.

TABLE 2

| Component of adhesive composition | Content in weight percent |
|---|---|
| Co-polymer of buthylacrylate and acryilonitrile (CBA) | 12.0–18.0 |
| Filler | 8.0–22.0 |
| Olygodieneurethane resin (OD) | 1.5–3.5 |
| Cross-linking agent | 15.0–30.0 |
| Solvent | 35.0–60.0 |

In the following non-limiting table 3 there are summarized particular formulations of the adhesive composition in comparison with the prior art.

TABLE 3

| Components | Number of the composition and its content in weight % | | | | | | |
|---|---|---|---|---|---|---|---|
|  | 1 | 2 | 3 | 4 | 5 | 6 | 7 |
| CBA |  | 15.2 |  | 12.8 | 14.9 | 17.1 | 14.9 |
| TiO2 | 13.0 | 15.2 | 17.5 | 10.8 | 14.9 | 19.1 | 14.9 |
| OD-1 |  |  |  | 2.9 |  |  |  |
| OD-2 |  |  |  |  |  |  | 2.2 |
| OD-3 |  |  | 2.6 |  | 2.2 |  |  |
| OD-4 |  |  |  |  |  | 1.7 |  |
| TPT (Desmodur R) | 17.0 | 20.4 | 23.5 |  | 20.0 | 17.0 | 20.0 |
| TPT (Desmodur RE) |  |  |  | 23.0 |  |  |  |
| Butadyene styrene rubber | 13.0 |  |  |  |  |  |  |
| Ethylacetate |  | 49.2 | 56.4 | 40.0 | 48.0 |  | 48.0 |
| Methylethylketone |  |  |  |  |  | 30 |  |
| Toluene | 38.0 |  |  | 10.5 |  | 15.1 |  |
| Cyclohexane | 19.0 |  |  |  |  |  |  |
| Total % | 100 | 100 | 100 | 100 | 100 | 100 | 100 |

The shear strength at room and elevated temperatures and in conditions of thermal shock as well as corrosion activity of the above adhesive compositions were tested. The obtained results are summarized in the following non-limiting table 4. The shear strength was measured in accordance with ASTM-D-1002 and the corrosion activity was determined in accordance with the German standard DIN 53489.

TABLE 4

| Property of adhesive composition | Composition number | | | | | | |
|---|---|---|---|---|---|---|---|
|  | 1 | 2 | 3 | 4 | 5 | 6 | 7 |
| Lap Shear Strength at 20 ± 1° C. on varnished duralumin samples, MPa | 0.9 | 2.1 | 0.3 | 2.8 | 3.1 | 3.2 | 3.2 |
| Lap Shear Strength at 125° C. after thermal aging on duralumin samples, during 1000 hours, MPa | 0.6 | 2.9 | 0.7 | 4.2 | 4.7 | 4.1 | 4.9 |
| Lap Shear Strength at 20 ± 1° C. on polished duralumin samples, after 100 thermal shocks, MPa | 0.7 | 1.7 | 0.5 | 4.0 | 4.3 | 3.9 | 4.2 |
| Corrosive activity with respect to copper | NC | NC | NC | NC | NC | NC | NC |

NC - no corrosion

One can clearly see that the new adhesive composition (formulations 4–7) are superior in comparison with the prior art compositions (formulations 1–3) both in terms of mechanical properties and in terms of corrosion activity.

It should be appreciated that the present invention is not limited to the above-described embodiments and that changes and modifications can be made by one ordinarily skilled in the art without deviation from the scope of the invention, as will be defined in the appended claims.

It should be appreciated that the features disclosed in the foregoing description, and/or in the following claims, and/or in the accompanying examples, and/or in the accompanying tables may, both separately and in any combination thereof, be material for realizing the present invention in diverse forms thereof.

Although certain presently preferred embodiments of the present invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

What is claimed is:

1. An adhesive composition for use in bonding of electronic parts on a board, said composition comprising
   a) 12.0–18.0 weight % of a first resin, said first resin being a cross-linkable clathrate matrix resin,
   b) 8.0–22.0 weight % of a particulated filler,
   c) 15.0–30.0 weight % of a cross-linking agent capable of cross-linking said first resin,
   d) 1.5–3.5 weight % of a second resin, said second resin being an olygodieneurethane resin with the end oxymethyloxazolidone groups, said second resin having general chemical formula

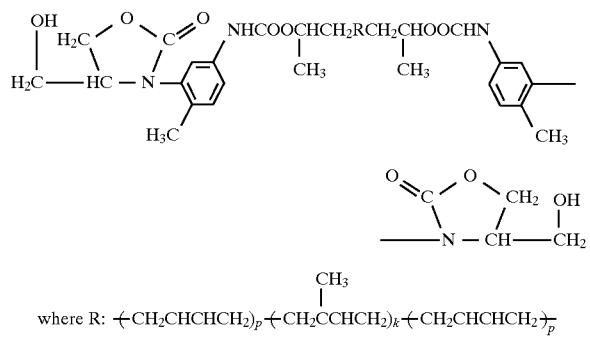

where R: $-(CH_2CHCHCH_2)_p-(CH_2CCHCH_2)_k-(CH_2CHCHCH_2)_p-$ p=17–31, k=8–15,
   e) 35.0–60.0 weight % of an organic solvent.

2. The adhesive composition as defined in claim 1, in which said first resin is a co-polymer of butylacrylate and acrylonitrile and said second resin contains a radical R, which is an aliphatic hydrocarbon capable of rendering the second resin with a high conformational ability and molecular weight 3000–5000.

3. The adhesive composition as defined in claim 2, in which said particulated filler is an inorganic compound chosen from the group consisting of oxides, nitrides, carbonates and said cross-linking agent is a solution of a polyisocyanate.

4. The adhesive composition as defined in claim 3, in which said particulated filler is $TiO_2$ and said cross-linking agent is a solution of triphenylmethano triisocyanate in dichloroethane, methylene chloride or ethyl acetate.

5. The adhesive composition as defined in claim 4, in which said organic solvent is chosen from the group consisting of ethyl acetate, methylethylketone, toluene, or their mixture.

* * * * *